United States Patent

Kawamura

(10) Patent No.: US 9,525,120 B2
(45) Date of Patent: Dec. 20, 2016

(54) MULTI-LAYER PIEZOELECTRIC ELEMENT AND PIEZOELECTRIC ACTUATOR, INJECTION DEVICE AND FUEL INJECTION SYSTEM INCLUDING THE SAME

(71) Applicant: KYOCERA Corporation, Kyoto-shi, Kyoto (JP)

(72) Inventor: Koji Kawamura, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/397,570

(22) PCT Filed: Aug. 10, 2013

(86) PCT No.: PCT/JP2013/071737
§ 371 (c)(1),
(2) Date: Oct. 28, 2014

(87) PCT Pub. No.: WO2014/025050
PCT Pub. Date: Feb. 13, 2014

(65) Prior Publication Data
US 2015/0122908 A1    May 7, 2015

(30) Foreign Application Priority Data

Aug. 10, 2012   (JP) ................... 2012-178464

(51) Int. Cl.
*B05B 1/08*    (2006.01)
*H01L 41/047*  (2006.01)
(Continued)

(52) U.S. Cl.
CPC ....... *H01L 41/0472* (2013.01); *B05B 17/0607* (2013.01); *F02M 51/0603* (2013.01);
(Continued)

(58) Field of Classification Search
CPC .................................................. H01L 41/0472
See application file for complete search history.

(56) References Cited

U.S. PATENT DOCUMENTS 6,794,800 B1    9/2004  Heinz
7,791,256 B2 *  9/2010  Nakamura ......... F02M 51/0603
                                         310/328
(Continued)

FOREIGN PATENT DOCUMENTS

EP    1162671 A2    12/2001
EP    2530756 A1    12/2012
(Continued)

OTHER PUBLICATIONS

International Search Report, PCT/JP2013/071737, Sep. 27, 2013, 1 pg.
(Continued)

*Primary Examiner* — Arthur O Hall
*Assistant Examiner* — Adam J Rogers
(74) *Attorney, Agent, or Firm* — Volpe and Koenig, P.C.

(57) ABSTRACT

There are provided a multi-layer piezoelectric element capable of suppressing the development of a small crack occurring at an interface between a piezoelectric layer and an internal electrode layer or in the internal electrode layer, and a piezoelectric actuator, an injection device and a fuel injection system including the same. A multi-layer piezoelectric element includes a stacked body in which piezoelectric layers and internal electrode layers are laminated, and an external electrode disposed on a side surface of the stacked body and electrically connected to the internal electrode layers through a conductive bonding material, the external electrode including protrusions protruding toward the stacked body.

7 Claims, 6 Drawing Sheets

(51) Int. Cl.
  *H01L 41/293* (2013.01)
  *F02M 51/06* (2006.01)
  *B05B 17/06* (2006.01)
  *H01L 41/083* (2006.01)
  *H01L 41/053* (2006.01)

(52) U.S. Cl.
  CPC .......... *H01L 41/083* (2013.01); *H01L 41/293* (2013.01); *H01L 41/053* (2013.01)

(56) References Cited

U.S. PATENT DOCUMENTS

| | | | | |
|---|---|---|---|---|
| 8,410,663 | B2* | 4/2013 | Sakamoto | H01L 41/0838 310/328 |
| 8,421,310 | B2* | 4/2013 | Setoguchi | F16K 31/007 310/328 |
| 8,432,085 | B2* | 4/2013 | Okamura | F02M 51/0603 310/328 |
| 2001/0047796 | A1* | 12/2001 | Yamada | F02M 47/027 123/498 |
| 2009/0220765 | A1* | 9/2009 | Okamura | H01L 41/0471 428/316.6 |
| 2010/0006678 | A1* | 1/2010 | Sato | H01L 41/083 239/585.1 |
| 2010/0326405 | A1* | 12/2010 | Nakamura | H01L 41/0838 123/498 |
| 2012/0280057 | A1 | 11/2012 | Satoi et al. | |

FOREIGN PATENT DOCUMENTS

| | | |
|---|---|---|
| JP | 2005-223014 A | 8/2005 |
| JP | 2006-303319 A | 11/2006 |
| JP | 2007-189092 A | 7/2007 |
| JP | 2010-114620 A | 5/2010 |
| WO | 2011/065182 A1 | 6/2011 |
| WO | 2011/093293 A1 | 8/2011 |

OTHER PUBLICATIONS

Extended European Search Report, European Patent Application No. 13828433.6, Mar. 7, 2016, 9 pgs.

Chinese Office Action with English concise explanation, Chinese Patent Application No. 201380019353.X, May 11, 2016, 7 pgs.

* cited by examiner (a)

(b)

(a)

(b)

(a)

(b)

(a)

(b)

MULTI-LAYER PIEZOELECTRIC ELEMENT AND PIEZOELECTRIC ACTUATOR, INJECTION DEVICE AND FUEL INJECTION SYSTEM INCLUDING THE SAME

TECHNICAL FIELD

The present invention relates to a multi-layer piezoelectric element which is used for, for example, a piezoelectric drive element (piezoelectric actuator), a pressure sensor element, a piezoelectric circuit element and the like, and a piezoelectric actuator, an injection device and a fuel injection system including the same.

BACKGROUND ART

The multi-layer piezoelectric element having a structure including a stacked body in which piezoelectric layers and internal electrode layers are laminated, and an external electrode disposed on a side surface of the stacked body and electrically connected to the internal electrode layers through a conductive bonding material is known (refer to Patent Literature 1).

CITATION LIST

Patent Literature

Patent Literature 1: Japanese Unexamined Patent Publication JP-A 2005-223014

SUMMARY OF INVENTION

Technical Problem

There is a problem that a small crack occurring, due to expansion/contraction of the multi-layer piezoelectric element at the time of driving, at an interface between the piezoelectric layer and the internal electrode layer or in the internal electrode layer pierces the conductive bonding material and is developed in an interface with respect to the external electrode, which may interfere with the electrical connection between the external electrode and the conductive bonding material and may reduce the durability.

The invention has been made in view of the above problem, and an object thereof is to provide a multi-layer piezoelectric element capable of suppressing the development of a small crack occurring at an interface between a piezoelectric layer and an internal electrode layer or in the internal electrode layer, and a piezoelectric actuator, an injection device and a fuel injection system including the same.

Solution to Problem

The invention provides a multi-layer piezoelectric element including: a stacked body in which piezoelectric layers and internal electrode layers are laminated, and an external electrode disposed on a side surface of the stacked body and electrically connected to the internal electrode layers through a conductive bonding material, the external electrode including protrusions protruding toward the stacked body.

In addition, the invention provides a piezoelectric actuator including: the multi-layer piezoelectric element mentioned above and a case housing the multi-layer piezoelectric element thereinside.

Further, the invention provides an injection device including a container provided with an injection hole; and the multi-layer piezoelectric element, a fluid stored in the container being injected through the injection hole by driving the multi-layer piezoelectric element.

Furthermore, the invention provides a fuel injection system including: a common rail configured to store a high-pressure fuel; the above-mentioned injection device configured to inject the high-pressure fuel stored in the common rail; a pressure pump configured to supply the high-pressure fuel to the common rail; and an injection control unit configured to send a drive signal to the injection device.

Advantageous Effects of Invention

In the multi-layer piezoelectric element according to the invention, since the external electrode includes the protrusions protruding toward the stacked body, a crack occurring at an interface between the piezoelectric layer and the internal electrode layer, or piercing the conductive bonding material from the internal electrode layer to be developed to an interface with respect to the external electrode stops at the protrusion. Additionally, as conduction between the external electrode and the conductive bonding material is constantly secured, electrical connection is held and the durability is improved.

BRIEF DESCRIPTION OF DRAWINGS

FIG. 4(b) is an explanatory view of an external electrode shown in FIG. 4(a) seen from the stacked body side;

FIG. 5(b) is a schematic perspective view of an external electrode shown in FIG. 5(a);

DESCRIPTION OF EMBODIMENTS

A multi-layer piezoelectric element according to an embodiment of the invention will be explained with reference to the drawings.

Figure 1:
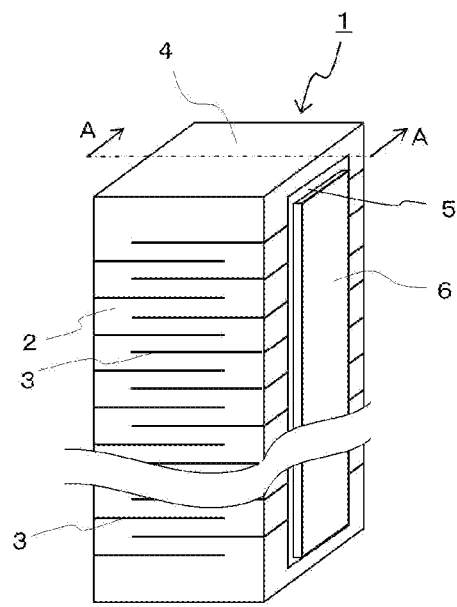
FIG. 1(a) is a schematic perspective view showing an embodiment of a multi-layer piezoelectric element according to the invention.
FIG. 1(b) is a partially-enlarged cross-sectional view taken along the line A-A shown in FIG. 1(a)
Figure 1:
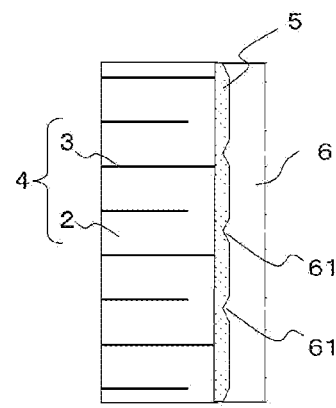

FIG. 1(a) is a schematic perspective view showing an embodiment of a multi-layer piezoelectric element according to the invention. FIG. 1(b) is a partially-enlarged cross-sectional view taken along the line A-A shown in FIG. 1(a). A multi-layer piezoelectric element 1 shown in FIG. 1 includes a stacked body 4 in which piezoelectric layers 2 and internal electrode layers 3 are laminated and an external electrode 6 disposed on a side surface of the stacked body 4 and electrically connected to the internal electrode layers 3 through a conductive bonding material 5, in which the external electrode 6 includes protrusions 61 protruding to the stacked body 4.

The stacked body 4 constituting the multi-layer piezoelectric element 1 is formed by laminating the piezoelectric layers 2 and the internal electrode layers 3, including, for example, an active portion in which the piezoelectric layers 2 and the internal electrode layers 3 are alternately laminated and inactive portions made of the piezoelectric layer 2 disposed at both ends of the active portion in a stacking direction thereof, which is formed in a rectangular parallelepiped shape of 0.5 to 10 mm in depth, 0.5 to 10 mm in width and 1 to 100 mm in height.

The piezoelectric layers 2 constituting the stacked body 4 are made of ceramics having piezoelectric characteristics, and for example, a perovskite type oxide made of lead zirconate titanate ($PbZrO_3$—$PbTiO_3$), lithium niobate ($LiNbO_3$), lithium tantalate ($LiTaO_3$) and like can be used as ceramics. The thickness of the piezoelectric layer 2 is set to, for example, 3 to 250 μm.

The internal electrode layers 3 constituting the stacked body 4 are formed by co-firing with the ceramics forming the piezoelectric layer 2, which are alternately laminated with the piezoelectric layer 2 so as to sandwich the piezoelectric layer 2 from above and below. A drive voltage is applied to the piezoelectric layers 2 sandwiched therebetween by arranging positive electrodes and negative electrodes. As forming materials, for example, a conductor mainly containing silver-palladium alloy which has low reactivity with piezoelectric ceramics, or conductors containing copper, platinum and the like can be used. In the example shown in FIG. 1, the positive electrode and the negative electrodes (or ground electrodes) are alternately led out to a pair of side surfaces opposite to each other in the stacked body and electrically connected to the outer electrode 6 through the conductive bonding material 5. The thickness of the internal electrode layer 3 is set to, for example, 0.1 to 5 μm.

On the side surface of the stacked body 4, the external electrode 6 is disposed through the conductive bonding material 5 so as to be electrically connected to the internal electrode layers 3.

The conductive bonding material 5 used here is preferably formed by, for example, a conductive adhesive made of epoxy resin or polyimide resin containing metal powders having good conductivity such as Ag powder and Cu powder. The conductive bonding material 5 is formed to have a thickness of, for example, 5 to 500 μm.

The external electrode 6 is a plate-like body made of a metal such as copper, iron, stainless steel or phosphor bronze, which is formed to have, for example, 20 to 80 mm in length, 0.5 to 10 mm in width and 0.01 to 1.0 mm in thickness. As shapes of the external electrode 6, for example, a shape with slits in a width direction of the external electrode and a metal plate processed in a reticular shape can be cited as shapes effective for alleviating stress generated by expansion/contraction of the stacked body 4, in addition to the simple flat-plate shape shown in FIG. 1. In the example shown in FIG. 3, slits 62 are provided in the width direction and holes 63 having a shape extending in the width direction are provided between slits 62. Moreover, the external electrode 6 may have a length longer than the above-described length and may have a length extending from end surfaces of the stacked body 4.

Figure 2:
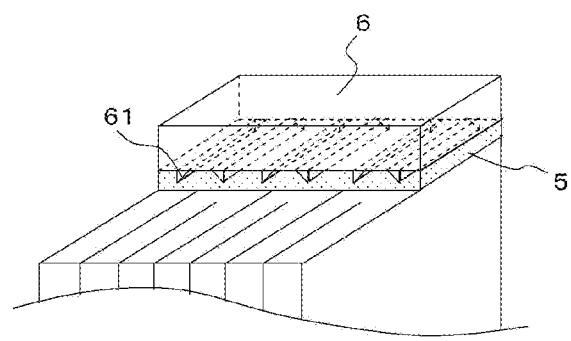
FIG. 2 is a partially-enlarged perspective view showing another embodiment of the multi-layer piezoelectric element according to the invention.

As shown in FIG. 1 and FIG. 2, it is preferable that the external electrode 6 is directly bonded to the side surface along the stacking direction of the stacked body 4 through the conductive bonding material 5. It is also preferable that a conductive layer 7 electrically connected to the internal electrode layers 3 is provided on the side surface of the stacked body 4 and the external electrode 6 is bonded on the surface of the conductive layer 7 through the conductive bonding material 5 as shown in FIG. 3.

Figure 3:
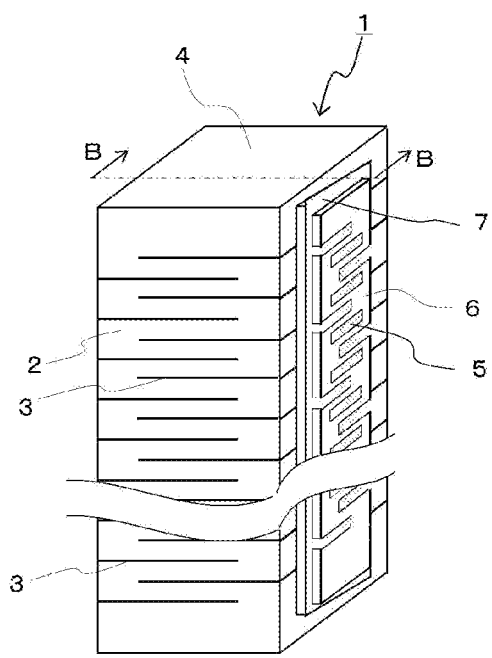
FIG. 3(a) is a schematic perspective view showing an embodiment of the multi-layer piezoelectric element according to the invention.
FIG. 3(b) is a partially-enlarged cross-sectional view taken along the line B-B shown in FIG. 3(a)
Figure 3:
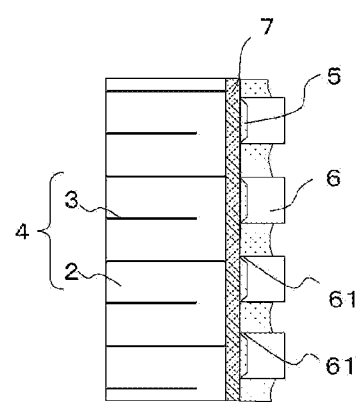

In the case shown in FIG. 3, a pair of conductive layers 7 provided on side surfaces of the stacked body 4 and electrically connected to the internal electrode layers 3 is formed by applying a paste made of, for example, silver and glass and baking it, which is bonded to the side surfaces of the stacked body 4 and electrically connected to the respective internal electrode layers 3 alternately led out to the facing side surfaces of the multilayer body 4. The thickness of the conductive layers 7 is set to, for example, 5 to 500 μm.

Additionally, the external electrode 6 has protrusions 61 protruding toward the stacked body 4.

According to this structure, a small crack occurring inside the stacked body 4 at the time of driving the multi-layer piezoelectric element 1 which will pierce the conductive bonding material 5 and will be developed in an interface with respect to the external electrode 6, stops at the protrusion 61 existing in the middle of a path, and therefore, the development of the crack can be suppressed. In the protrusion 61, conduction between the external electrode 6 and the conductive bonding material 5 is constantly secured. Therefore, electrical connection with respect to the external electrode 6 is maintained and the durability is improved.

A protruding amount (length) of the protrusions 61 is preferably at least 0.01 mm, and is preferably 10% or more of the thickness of the conductive bonding material 5. As shapes of the protrusions 61, a shape tapering toward the end in cross section (for example, a V-shape in cross section), a shape becoming gradually wider toward the end in cross section which is converse to the above, an anchor shape (for example, an L-shape in cross section) and so on can be cited. The shape tapering toward the end in cross section (for example, the V-shape in cross section) is preferable from a point of view that the protrusion 61 is allowed to penetrate into the later-descried conductive layer 7. The shape becoming gradually wider toward the end in cross section which is converse to the above and the anchor shape (for example, the L-shape in cross section) can be preferably applied from a point of view of the anchor effect.

Here, it is preferable that the protrusions 61 extend in a width direction of the external electrode 6 which is perpendicular to the stacking direction as shown in FIG. 2. Here, extending in the width direction means that the protrusions have a shape elongated in the width direction. According to the structure, an area in which the development of the crack in the stacking direction is blocked extends in the width direction, which can suppress the development of the crack in the stacking direction more effectively. It is also possible to further increase an area in which conduction is constantly secured.

Figure 4:
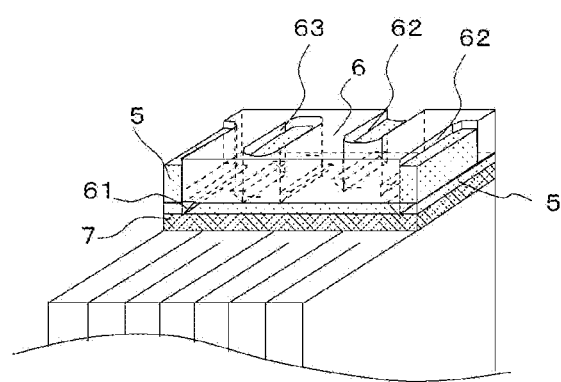
FIG. 4 (a) is a partially-enlarged perspective view showing another embodiment of the multi-layer piezoelectric element according to the invention.
Figure 4:
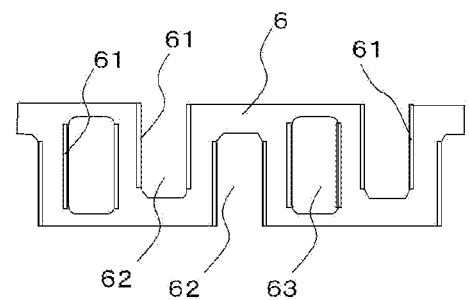

Moreover, as shown in FIG. 4, it is preferable that the external electrode 6 has at least one of a plurality of slits 62 alternately extending from opposite ends of the external electrode in the width direction, toward a central part thereof and a plurality of holes 63 extending in the width direction of the external electrode and that protrusions are disposed in peripheral edges of the slits 62 or the holes 63.

According to this structure, it is possible to suppress the crack which has pierced the conductive material 5 toward the slit 62 or the hole 63 to be developed in the stacking direction.

It is particularly preferable that the protrusion 61 extends continuously from end to end of the slit 62 or the hole 63 in the width direction of the external direction 6 as shown in FIG. 4. This can be applied, for example, in a case where the slit 62 and the hole 63 have a rectangular shape seen from the front (a direction perpendicular to the side surface). According to the structure, it is possible to completely prevent the crack which has pierced the conductive material 5 toward the slit 62 or the hole 63 from being developed in the stacking direction.

Figure 5:
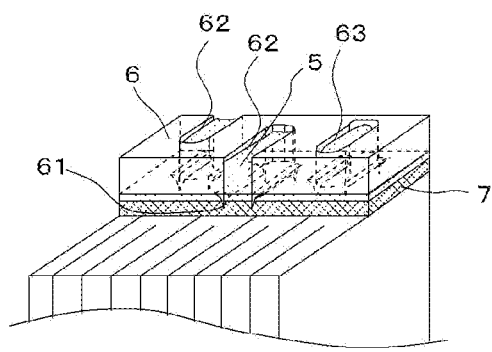
FIG. 5 (a) is a partially-enlarged perspective view showing another embodiment of the multi-layer piezoelectric element according to the invention.
Figure 5:
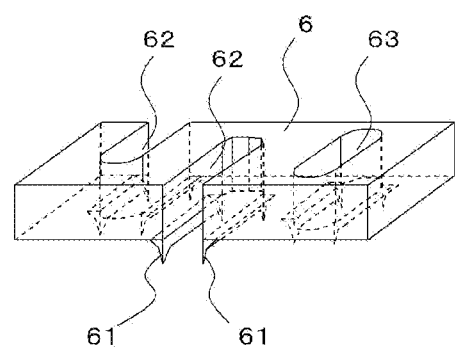

As shown in FIG. 5 (b), it is further preferable that a protruding length of the protrusion 61 at ends thereof in the width direction is larger than a protruding length of the protrusion 61 at a central part thereof in the width direction. According to this structure, a following property with respect to expansion/contraction of the stacked body 4 at the time of driving is increased from the widely-protruding protrusions 61 as starting points, and therefore, the bonding strength between the external electrode 6 and the conductive bonding material 5 can be maintained.

As shown in FIG. 5 (a), when the conductive layer 7 electrically connected to the internal electrode layers 3 is provided on the side surface of the stacked body 4, namely, when the conductive layer 7 is provided between the side surface of the stacked body 4 and the conductive bonding material 5, it is preferable that the protrusion 61 penetrates into the conductive layer 7 at ends in the width direction. As the protrusions 61 pierce the conductive bonding material 5 and penetrate into the conductive layer 7, the conductive layer 7 and the external electrode 6 simultaneously move with expansion/contraction of the stacked body 4 at the time of driving, which further improves the reliability in electrical connection.

A protruding amount (length) of the protrusions 61 at the ends in the width direction is preferably at least 0.05 mm, and it is effective that the protrusions 61 pierce the conductive bonding material 5 and protrude to a position corresponding to 80% of the thickness of the conductive layer 7.

The protrusions 61 may pierce the conductive bonding material 5 and penetrate into the conductive layer 7 not only at the ends in the width direction but also at other portions. For example, the protrusions 61 can pierce the conductive bonding material 5 and penetrate into the conductive layer 7 at the central part in the width direction. It is further preferable that the protrusions 61 penetrate into the conductive layer at the whole area in the width direction, which can further improve the reliability in electrical connection.

Furthermore, the protrusions 61 preferably penetrate into the conductive layer 7 even in the case of protrusions 61 not extending from end to end in the width direction, which keeps the electrical connection between the external electrode 6 and the conductive layer 7 and improves the durability.

Figure 6:
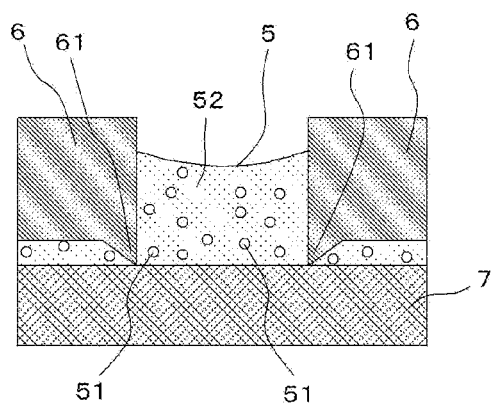
FIG. 6 is a partially-enlarged cross-sectional view showing another embodiment of the multi-layer piezoelectric element according to the invention.

As shown in FIG. 6, the conductive bonding material 5 is configured so that metal particles 51 are dispersed in a resin 52, and the metal particles 51 preferably contain a metal component the same as that present at least on the surface of the protrusion 61. For example, a configuration in which a film made of silver is provided on the surface of the protrusions 61 with a thickness of 1 to 15 μm by plating and 50 to 90% of a silver component is contained in the metal particles 51 can be cited.

In addition to silver, gold, copper, nickel and the like can be used, equally.

Since the metal particles 51 contain the same metal component as the metal component present at least on the surface of the protrusion 61, the difference between the surface of the protrusions 61 and the metal particles 51 due to thermal expansion can be reduced, and the bonding strength between the external electrode 6 and the conductive bonding material 5 can be increased.

Next, a manufacturing method of the multi-layer piezoelectric element 1 according to the embodiment will be explained.

First, a ceramic green sheet to be the piezoelectric layer 2 is prepared. Specifically, a ceramic slurry is made by mixing calcined powder of piezoelectric ceramics, a binder composed of an organic polymer such as an acrylic polymer or a butyral polymer, and a plasticizer. Then, the ceramic green sheet is prepared by using the ceramic slurry by applying a tape molding method such as a doctor blade method or a calendar roll method. The piezoelectric ceramics having piezoelectric characteristics can be applied, and a perovskite type oxide composed of lead zirconate titanate ($PbZrO_3$—$PbTiO_3$) or the like can be used for example. As the plasticizer, dibutyl phthalate (DBP), dioctyl phthalate (DOP) or the like can be used.

Next, a conductive paste to be the internal electrode layer 3 is prepared. Specifically, the conductive paste is prepared by adding and mixing a binder and a plasticizer to metal powder of a silver-palladium alloy. The conductive paste is applied on the ceramic green sheet by using a screen printing method in a pattern of the internal electrode layer 3. Furthermore, a plurality of ceramic green sheets on which the conductive paste is printed are laminated and a debinding process is performed at a given temperature, and then, the sheets are fired at a temperature of 900 to 1200° C. and a grinding process is performed by using a surface grinder or the like to be a given shape, thereby preparing the stacked body 4 having the piezoelectric layers 2 and the internal electrode layers 3 which are alternately laminated.

The stacked body 4 is not limited to the one prepared by the above-described manufacturing method, and can be prepared by any manufacturing method as long as the stacked body 4 can be prepared by laminating the plurality of the piezoelectric layers 2 and the internal electrode layers 3.

After that, as necessary, a silver-glass containing conductive paste prepared by adding a binder, a plasticizer and a solvent to a mixture of conductive particles mainly containing silver and glass is printed on the side surface of the stacked body in the pattern of the conductive layers by the screen printing method or the like and dried, and then, a baking process is performed at a temperature of 650 to 750° C. to thereby form the conductive layer 7.

Next, the external electrode 6 is bonded to the stacked body 4 through the conductive bonding material 5. In the case where the conductive layer 7 is formed on the side surface of the stacked body 4, the external electrode 6 is bonded to the surface of the conductive layer 7.

The formation of the conductive bonding material 5 can be controlled to be a given thickness and width by the screen printing or a dispenser method using an adhesive made of epoxy resin or polyimide resin including metal powders having good conductivity such as Ag powder or Cu powder, solder or the like.

The external electrode 6 is made of a flat plate of a metal such as copper, iron, stainless steel or phosphor bronze, and protrusions can be formed in the metal flat plate after or at the same time as the punching by using, for example, a die having a shape corresponding to the protrusions 61. It is also possible to form the protrusions 61 at predetermined positions by performing punching by a pair of male and female dies processed to a desired shape and adjusting the clearance of the pair of dies at this time. The protrusions can be formed by a filing process after being punched once by the die, or can be formed by welding.

After that, a DC electric field of 0.1 to 3 kV/mm is applied to the external electrodes 6 respectively connected to a pair of side surfaces of the stacked body 4 (surfaces of a pair of conductive layers 7), and the piezoelectric layers 2 constituting the stacked body 4 are polarized to thereby complete the multi-layer piezoelectric element 1. The multi-layer piezoelectric element 1 connects the conductive layers 7 to an external power source through the external electrodes 6, and a voltage is applied to the piezoelectric layers 2, thereby it is possible to greatly displace respective piezoelectric layers 2 by the inverse piezoelectric effect. Accordingly, the element can function as an automotive fuel injection valve which performs injection supply of fuel to, for example, an engine.

Figure 7:
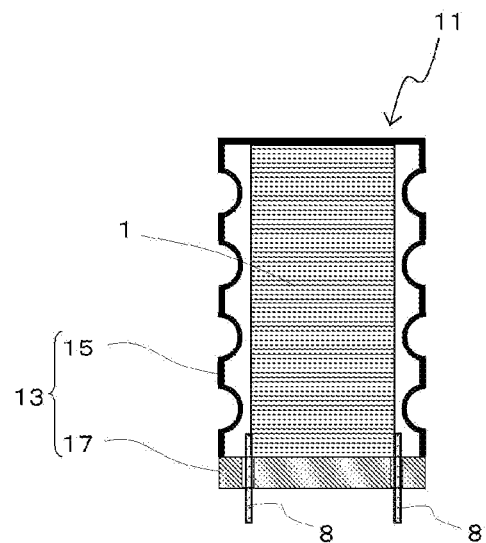
FIG. 7 is a schematic cross-sectional view showing an embodiment of a piezoelectric actuator according to the invention.

Next, an embodiment of a piezoelectric actuator according to the invention will be explained. FIG. 7 is a schematic cross-sectional view showing an embodiment of a piezoelectric actuator according to the invention.

As shown in FIG. 7, a piezoelectric actuator 11 of the embodiment is configured by housing the multi-layer piezoelectric element 1 in a case 13.

Specifically, the case 13 is composed of a case body 15 in which an upper end is closed and a lower end is opened, and a lid member 17 attached to the case body 15 so as to close the opening of the case body 15, and the multi-layer piezoelectric element 1 is enclosed and housed in the case 13 together with, for example, an inert gas so that both end surfaces of the multi-layer piezoelectric element 1 respectively abut on an upper-end inner wall and a lower-end inner wall of the case 13.

The case body 15 and the lid member 17 are made of a metal material such as SUS304 or SUS316L. The case body 15 is a tubular body in which the upper end is closed and the lower and is opened, which has, for example, a bellows shape so as to be expanded/contracted in the stacking direction of the stacked body 7. The lid member 17 is formed, for example, in a plate shape so as to close the opening of the case body 15. Two through holes into which external lead members 8 can be inserted are formed in the lid member 17, and the external electrodes 6 are electrically connected to the outside by inserting the external lead members 8 into the through holes. Gaps of the through holes are filled with soft glass or the like, which fix the external lead members 8 and prevents infiltration of outside air.

The piezoelectric actuator 11 according to the embodiment enables stable driving for a long period of time.

Figure 8:
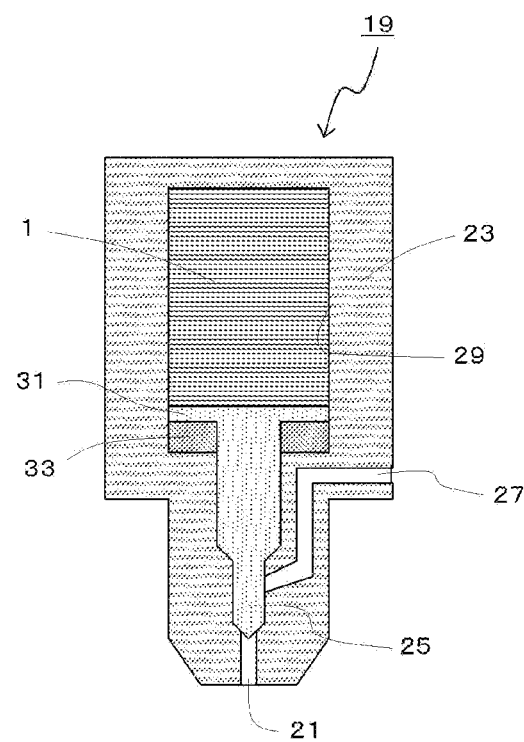
FIG. 8 is a schematic cross-sectional view showing an embodiment of an injection device according to the invention.

Next, an embodiment of an injection device according to the invention will be explained. FIG. 8 is a schematic cross-sectional view showing an embodiment of an injection device according to the invention.

As shown in FIG. 8, an injection device 19 of the embodiment is configured by housing the multi-layer piezoelectric element 1 of the above embodiment inside a housing container (container) 23 provided with an injection hole 21 at one end thereof.

A needle valve 25 which can open and close the injection hole 21 is arranged inside the housing container 23. In the injection hole 21, a fluid passage 27 is disposed so as to be communicated in accordance with the movement of the needle valve 25. The fluid passage 27 is connected to an external fluid supply source, and the fluid is constantly supplied to the fluid passage 27 at high pressure. Accordingly, the injection device is configured so that, when the needle valve 25 opens the injection hole 21, the fluid supplied to the fluid passage 27 is injected through the injection hole 21 to the outside or an adjacent container, for example, a fuel chamber (not shown) of an internal-combustion engine.

An inner diameter of an upper end portion of the needle valve 25 is large, which forms a piston 31 which can slide with a cylinder 29 formed in the housing container 23. Then, the multi-layer piezoelectric element 1 of the above embodiment is housed in the housing container 23 so as to contact the piston 31.

In such an injection device 19, as the multi-layer piezoelectric element 1 is expanded by voltage application, the piston 31 is pressed and the needle valve 25 closes the fluid passage 27 communicated to the injection hole 21 to stop the supply of fluid. When the voltage application is stopped, the multi-layer piezoelectric element 1 is contracted, a disc spring 33 presses back the piston 31, the fluid passage 27 is opened and the injection hole 21 is communicated to the fluid passage 27, thereby injecting the fluid through the injection hole 21.

The injection device may be configured to open the fluid passage 27 by applying the voltage to the multi-layer piezoelectric element 1 and to close the fluid passage 27 by stopping the voltage application.

The injection device 19 of the embodiment may include the container 23 provided with the injection hole 21 and the multi-layer piezoelectric element 1 of the above embodiment, wherein the fluid filled inside the container 23 is injected through the injection hole 21 by driving the multi-layer piezoelectric element 1. That is, it is not always necessary that the multi-layer piezoelectric element 1 is inside the container 23 but it is sufficient that a pressure for controlling the injection of fluid is applied to the inside of the container 23 by driving the multi-layer piezoelectric element 1. In the injection device 19 of the embodiment, the fluid includes various types of liquids and gases such as the conductive paste in addition to fuel, ink and so on. By using the injection device 19 of the embodiment, it is possible to control the flow rate and the injection timing of the fluid stably for a long period of time.

In the case where the injection device 19 of the embodiment applying the multi-layer piezoelectric element 1 according to the above embodiment is used for the internal-combustion engine, it is possible to inject the fuel to the combustion chamber of the internal-combustion engine such as an engine accurately for a long period of time as compared with a conventional injection device.

Figure 9:
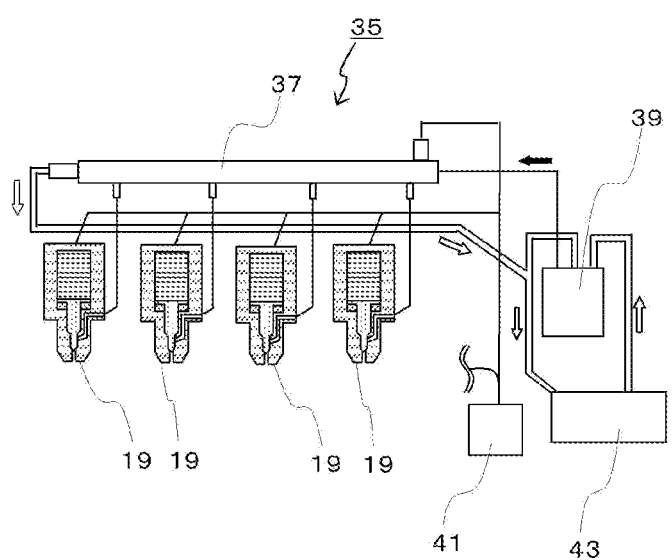
FIG. 9 is a schematic view showing an embodiment of a fuel injection system according to the invention.

Next, an embodiment of a fuel injection system according to the invention will be explained. FIG. 9 is a schematic view showing an embodiment of a fuel injection system according to the invention.

As shown in FIG. 9, a fuel injection system 35 of the embodiment includes a common rail 37 configured to store a high-pressure fuel as high-pressure fluid, a plurality of injection devices 19 according to the above embodiment configured to inject the high-pressure fluid stored in the common rail 37, a pressure pump 39 configured to supply the high-pressure fluid to the common rail 37, and an injection control unit 41 configured to send drive signals to the injection devices 19.

The injection control unit 41 controls the injection amount and timing of high-pressure fluid based on external information or the signal from the outside. For example, in the case where the fuel injection system 35 of the embodiment is used for the fuel injection of the engine, the amount and timing of fuel injection can be controlled while detecting the condition in the combustion chamber of the engine by a sensor or the like. The pressure pump 39 has a function of supplying the fluid fuel to the common rail 37 at high pressure from a fuel tank 43. For example, in the case of the fuel injection system 35 of the engine, the fluid fuel is fed to the common rail 37 with high pressure of 1000 to 2000 atmospheres (approximately 101 MPa to approximately 203 MPa), and preferably 1500 to 1700 atmospheres (approximately 152 MPa to approximately 172 MPa). The common rail 37 stores high-pressure fuel fed from the pressure pump 39 to be appropriately fed to the injection devices 19. Each injection device 19 injects a fixed amount of fluid to the outside or the adjacent container from the injection hole 21 as described above. For example, where a target of fuel supply by injection is an engine, the injection device injects the high-pressure fuel in a mist form into the combustion chamber of the engine through the injection hole 21.

According to the fuel injection system 35 of the embodiment, it is possible to perform desired injection of high-pressure fuel stably for a long period of time.

The invention is not limited to the above embodiments, and various modifications are possible without departing from the scope of the invention. For example, the external electrodes 6 in the multi-layer piezoelectric element 1 are respectively one by one formed on two opposite side surfaces of the stacked body 4 of the embodiment, however, the two external electrodes 6 can be formed on adjacent side surfaces, or can be formed on the same side surface of the stacked body 4. The cross-sectional shape of the stacked body 4 in a direction orthogonal to the stacking direction can be polygonal shapes such as hexagons and octagons, a circular shape or shapes of combination of straight lines and arcs, in addition to the quadrangle shape which is an example of the above embodiment.

Examples

Hereinafter, experiments were performed by preparing the multi-layer piezoelectric element 1 according to an example and a multi-layer piezoelectric element according to a comparative example.

A piezoelectric actuator including the multi-layer piezoelectric element 1 according to the example was prepared as follows. First, a ceramic slurry was made by mixing calcined powder of piezoelectric ceramics mainly containing lead zirconate titanate ($PbZrO_3$—$PbTiO_3$) having an average particle size of 0.4 μm, a binder and a plasticizer. The ceramic slurry was shaped into 50 μm-thick ceramic green sheets for forming the piezoelectric layers by the doctor blade method.

Next, a conductive paste for forming the internal electrode layers is prepared by adding a binder to a silver-palladium alloy.

Next, the conductive paste for forming the internal electrode layers was printed on one side of the ceramic green sheet by the screen printing method, and 200 ceramic green sheets on which the conductive paste was printed were laminated. Additionally, 15 ceramic green sheets in total on which the conductive paste for forming the internal electrode layers was not printed were laminated above and below the 200 ceramic green sheets for forming the internal electrode layers on which the conductive paste was printed were laminated so as to be interposed therebetween.

Then, the laminated sheets were fired at 980 to 1100° C., and the fired laminated sheets were ground by using the surface grinder in a shape of 5 mm square to obtain the stacked body. Next, a conductive paste obtained by mixing a binder to silver and glass was printed by the screen printing method on portions where the conductive layers would be formed on side surfaces along the stacking direction of the stacked body, and the baking process was performed at 700° C. to form the conductive layers.

Next, the conductive bonding material in a mixed paste state of Ag powder and polyimide resin was applied on the surfaces of the conductive layers by the dispenser, and the external electrodes were put on the surfaces of the stacked body and fixed there by curing the conductive bonding material.

Here, the external electrode according to the example was formed by plating silver in a thickness of 1 to 15 μm to a flat plate made of phosphor bronze having 1.5 mm in width and 0.1 mm in thickness, and thereafter by performing punching by a pair of male and female dies in which a plurality of rectangular slits were provided in the width direction. Then, the clearance of the punching dies was adjusted, thereby forming the external electrode in which protrusions were continuously formed with a height of 0.01 mm from end to end along peripheral edges of the slits so as to be parallel in the width direction.

On the other hand, the external electrode as the comparative example was formed by plating silver in a thickness of 1 to 15 μm to a flat plate made of phosphor bronze having 1.5 mm in width and 0.1 mm in thickness.

A DC electric field of 3 kV/mm was applied to external electrodes of these multi-layer piezoelectric elements for 15 minutes through the lead members connected to the external electrodes by welding to perform polarization, and then, a DC voltage of 160 V was applied. As a result, a displacement amount of 30 μm was obtained in the stacking direction of the stacked body.

Furthermore, a durability test was preformed in which these multi-layer piezoelectric elements were driven continuously under application of AC voltage ranging from 0 V to +160 V at a frequency of 150 Hz at a temperature of 30° C. and at a humidity of 90%. In the multi-layer piezoelectric element according to the comparative example, a crack was developed at an interface between the external electrode and the conductive bonding material after continuous driving of $1 \times 10^4$ times and the driving displacement amount was reduced. On the other hand, in the multi-layer piezoelectric element according to the embodiment, it was confirmed that the development of a crack was suppressed even after continuous driving of $1 \times 10^7$ times and stable driving was performed.

From the above results, according to the invention, the multi-layer piezoelectric element having excellent durability for a long period of time can be realized.

REFERENCE SIGNS LIST

1: Multi-layer piezoelectric element
2: Piezoelectric layer
3: Internal electrode layer
4: Stacked body
5: Conductive bonding material 6: External electrode
61: Protrusion
7: Conductive layer
11: Piezoelectric actuator
13: Case
15: Case body
17: Lid member
8: External lead member
19: Injection device
21: Injection hole
23: Housing container (container)
25: Needle valve
27: Fluid passage
29: Cylinder
31: Piston
33: Disc spring
35: Fuel injection system
37: Common rail
39: Pressure pump
41: Injection control unit
43: Fuel tank

The invention claimed is:

1. A multi-layer piezoelectric element, comprising:
a stacked body in which piezoelectric layers and internal electrode layers are laminated; and
an external electrode adhered to a side surface of the stacked body with a conductive bonding material and electrically connected to the internal electrode layers,
wherein the external electrode includes at least one of a plurality of slits alternately extending from opposite ends of the external electrode in a width direction thereof toward a central part of the external electrode and a plurality of holes extending in the width direction of the external electrode, and
protrusions which protrude toward the stacked body are disposed in peripheral edges of the slits or the holes, and
a conductive layer electrically connected to the internal electrode layers is provided on a side surface of the stacked body, and
each of the protrusions penetrates into the conductive layer and electrically connects the conductive layer.

2. The multi-layer piezoelectric element according to claim 1,
wherein the protrusions extend in a width direction of the external electrode which is perpendicular to a stacking direction.

3. The multi-layer piezoelectric element according to claim 2,
wherein each of the protrusions extends continuously from end to end of each of the slits or each of the holes in the width direction.

4. The multi-layer piezoelectric element according to claim 3,
wherein a protruding length of each of the protrusions at ends thereof in the width direction is larger than a protruding length of each of the protrusions in a central part thereof in the width direction.

5. The multi-layer piezoelectric element according to claim 4,
wherein a conductive layer electrically connected to the internal electrode layers is provided on a side surface of the stacked body, and
each of the protrusions penetrates into the conductive layer at ends in the width direction.

6. The multi-layer piezoelectric element according to claim 1,
wherein the conductive bonding material is configured so that metal particles are dispersed in a resin, and
the metal particles contain a metal component the same as that present at least on a surface of each of the protrusions.

7. A piezoelectric actuator, comprising:
the multi-layer piezoelectric element according to claim 1; and
a case which houses the multi-layer piezoelectric element thereinside.

* * * * *